United States Patent [19]

Onoda

[11] Patent Number: 5,717,357
[45] Date of Patent: Feb. 10, 1998

[54] OUTPUT CIRCUIT FOR SELECTIVELY OUTPUTTING A SIGNAL AT ONE OF TWO VOLTAGE LEVELS

[75] Inventor: Isamu Onoda, Tokyo, Japan

[73] Assignee: Ando Electric Co., Ltd., Tokyo, Japan

[21] Appl. No.: 599,943

[22] Filed: Feb. 14, 1996

[30] Foreign Application Priority Data

Feb. 28, 1995 [JP] Japan ................. 7-065006

[51] Int. Cl.$^6$ ........................... H03K 17/74
[52] U.S. Cl. ............... 327/504; 327/493; 327/583
[58] Field of Search ................... 327/504, 503, 327/112, 108, 493, 494, 583, 587

[56] References Cited

U.S. PATENT DOCUMENTS

| | | | |
|---|---|---|---|
| 3,818,248 | 6/1974 | Pittman | 327/493 |
| 4,433,303 | 2/1984 | Sasaki | 330/264 |
| 4,688,001 | 8/1987 | Dijkmans et al. | 330/273 |
| 4,706,039 | 11/1987 | Dijkmans et al. | 330/297 |
| 4,864,249 | 9/1989 | Reiffin | 330/263 |

*Primary Examiner*—Timothy P. Callahan
*Assistant Examiner*—Terry L. Englund
*Attorney, Agent, or Firm*—Flynn, Thiel, Boutell & Tanis, P.C.

[57] ABSTRACT

An output circuit is provided for obtaining an output signal at one of two voltages regardless of the relative difference between the voltage levels. The output circuit includes a first switching circuit that contains two current sources for selectively producing one of two constant currents. A second switching circuit receives one of the two constant currents. The first and second switches are connected by four series-connected forward biased diodes. There are also bypass connectors for selectively providing current around the first and fourth diodes. An output terminal is located between the second and third diodes. A high voltage source is located between the first switching circuit and the first diode. A low voltage source is located between the fourth diode and the second switching circuit. Depending which of the current sources are actuated, the signal present at the output terminal is either that of the high voltage source or that of the low voltage source. The first and fourth diodes prevent current from the non-selected voltage source effecting the voltage of the output signal.

3 Claims, 3 Drawing Sheets

5,717,357

OUTPUT CIRCUIT FOR SELECTIVELY OUTPUTTING A SIGNAL AT ONE OF TWO VOLTAGE LEVELS

BACKGROUND OF THE INVENTION

FIELD OF THE INVENTION

The present invention relates to a binary output circuit for driving a driver circuit of an IC tester.

BACKGROUND OF THE INVENTION

An arrangement of a conventional binary output circuit will be explained with reference to FIG. 2.

Denoted by 10 is a switching circuit, 13 through 16 are diodes, 17 is an output terminal, 20 is a switching circuit 20, 30A is a high level power supply, and 30B is a low level power supply. The switching circuit 10 comprises a constant-current supply 11a for flowing a current value 2I, a switch 12a connected in series to the constant-current supply 11a, a constant-current supply 11b for flowing a current value I, and a switch 12b connected in series to the constant-current supply 11b, wherein outputs of the switches 12a and 12b are connected to each other. The switching circuit 20 comprises a switch 22a, a constant-current supply 21a connected in series to the switch 22a for receiving a current value 2I, a switch 22b, and a constant-current supply 21b connected in series to the switch 22b for receiving the current value I wherein inputs of the switches 22a and 22b are connected to each other. Switches 22a, 22b and 12a,12b are electrically controlled switches set by a circuit to set the voltage level of the signal present at output terminal 17.

An output of the switching circuit 10 is connected to the high level power supply 30A by way of the diode 13 which is arranged in a forward direction, and also connected to an input of the switching circuit 20 by way of series connected diodes 14 and 15 which are connected in parallel with the diode 13. The low level power supply 30B is connected to the input of the switching circuit 20 by way of a diode 16. The output terminal 17 is provided at a connection between a cathode of the diode 14 and an anode of the diode 15.

The operation of the conventional binary output circuit will be now described with reference to FIG. 2. When a voltage VH of the high level power supply 30A is the desired output of terminal 17, the switch 12a of the switching circuit 10 operates so as to flow the current value 2I from the constant-current supply 11a while the switch 12b is not operative. On the other hand, the switch 22b of the switching circuit 20 operates while the switch 22a is open.

As a result, the current value I flows from the constant-current supply 11a of the switching circuit 10 to the constant-current supply 21b of the switching circuit 20 by way of the diodes 14 and 15. Consequently, the remaining current value I outputted by constant current supply 11a flows to the high level power supply 30A by way of the diode 13. If there is no load in the output terminal 17, the current value I equally flows to the diodes 13 and 14, and the voltage VH of the high level power supply 30A is outputted to the output terminal 17 since diode characteristic of the diode 13 is equal to that of the diode 14. When the voltage VH is outputted from the output terminal 17, the diode 16 connected to the low level power supply 30B is in a reverse mode so that the voltage VH alone is correctly outputted.

When a voltage VL of the low level power supply 30B is outputted to the output terminal 17, the switch 12b of the switching circuit 10 operates so as to flow the current value I from the constant-current supply 11b while the switch 12a is open. On the other hand, the switch 22a of the switching circuit 20 operates so as to flow the current value 2I through the constant-current supply 21a while the switch 22b is open.

As a result, the current value I flows from the constant-current supply 11b of the switching circuit 10 to the constant-current supply 21a of the switching circuit 20 by way of the diodes 14 and 15. Further, the current value I flows from the low level power supply 30B to the constant-current supply 21a of the switching circuit 20 by way of the diode 16. If there is no load in the output terminal 17, the current value I equally flows through the diodes 15 and 16, and further since the diode characteristic of the diode 15 is equal to that of the diode 16, the voltage VL of the low level power supply 30B is outputted to the output terminal 17. When the voltage VL is outputted from the output terminal 17, the diode 13 connected to the high level power supply 30A is in a reverse bias so that the voltage VL alone is correctly outputted.

When the switches 12a and 12b of the switching circuit 10, and the switches 22a and 22b of the switching circuit 20 are open, a voltage V0 of the output terminal 17 is in a high impedance. When the switching circuits 10 and 20 are switched at high speed with the circuit arrangement in FIG. 2, there is obtained an output signal having an amplitude of an output voltage level which is equal to the voltage VH of the high level power supply 30A and the voltage VL of the low level power supply 30B. The circuit arrangement of FIG. 2 is well known as the binary output circuit for use in the IC tester.

With the arrangement of the binary output circuit in FIG. 2, when the difference in voltage level between the voltage VH of the high level power supply 30A and the voltage VL of the low level power supply 30B respectively outputted from the output terminal 17 is relatively small, a current flows through the diodes 13 and 16 which should normally be non-conductive. As an amplitude is reduced, an offset of the output level is increased, it has been difficult to obtain a signal having a voltage equal to the selected high or low voltage level.

SUMMARY OF THE INVENTION

It is an object of the present invention to provide an output circuit capable of providing a signal at one of two voltage levels regardless of the difference in voltage levels.

To achieve the object, the output circuit comprises a switching circuit 1 including a constant-current supply 2a for flowing a current value 2I, a switch 1a connected in series to the constant-current supply 2a, a constant-current supply 2b for flowing a current value I, and a switch 1b connected in series to the constant-current supply 2b. A high level power supply 30A is connected to the output of the switch 1a by way of diodes 3a and 3b which are arranged in a forward bias relative to constant current supply 2a and are connected in series to each other. A diode 4 is connected in parallel with anodes of the diodes 3a and 3b, diode 4 being connected in series to the switch 1b of the switching circuit 1. Diodes 14 and 15 are arranged in a forward bias relative to switching circuit 1 and are connected in series to the diode 4. An output terminal 17 is provided at a connection between the diodes 14 and 15. A diode 5 is arranged in a forward direction and connected in series between diode 15 and switch 9A. A low level power supply 30B is connected to a cathode of the diode 5 by way of diodes 6a and 6b which are arranged in a forward bias relative to the low level power supply; and are connected in series to each other. A switching circuit 7 includes a switch 9a connected to the cathode of the diode 5, a constant-current supply 8a connected in series to the switch 9a for receiving the current value 2I, a switch 9b connected to the anode of the diode 5 and a constant-current supply 8b connected in series to a switch 9b for receiving the current value I, when a voltage VH of the high level power supply 30A is outputted to the output terminal 17, the switch 1a of the switching circuit 1 and the switch 9b of the switching circuit 7 are closed, while when a voltage VL of the low level power supply 30B is outputted to the output terminal 17, the switch 1b of the switching circuit 1 and the switch 9a of the switching circuit 7 are closed.

PREFERRED EMBODIMENT OF THE INVENTION

An arrangement of a binary output circuit according to the preferred embodiment of the present invention will be now described with reference to FIGS. 1 and 3.

Figure 1:
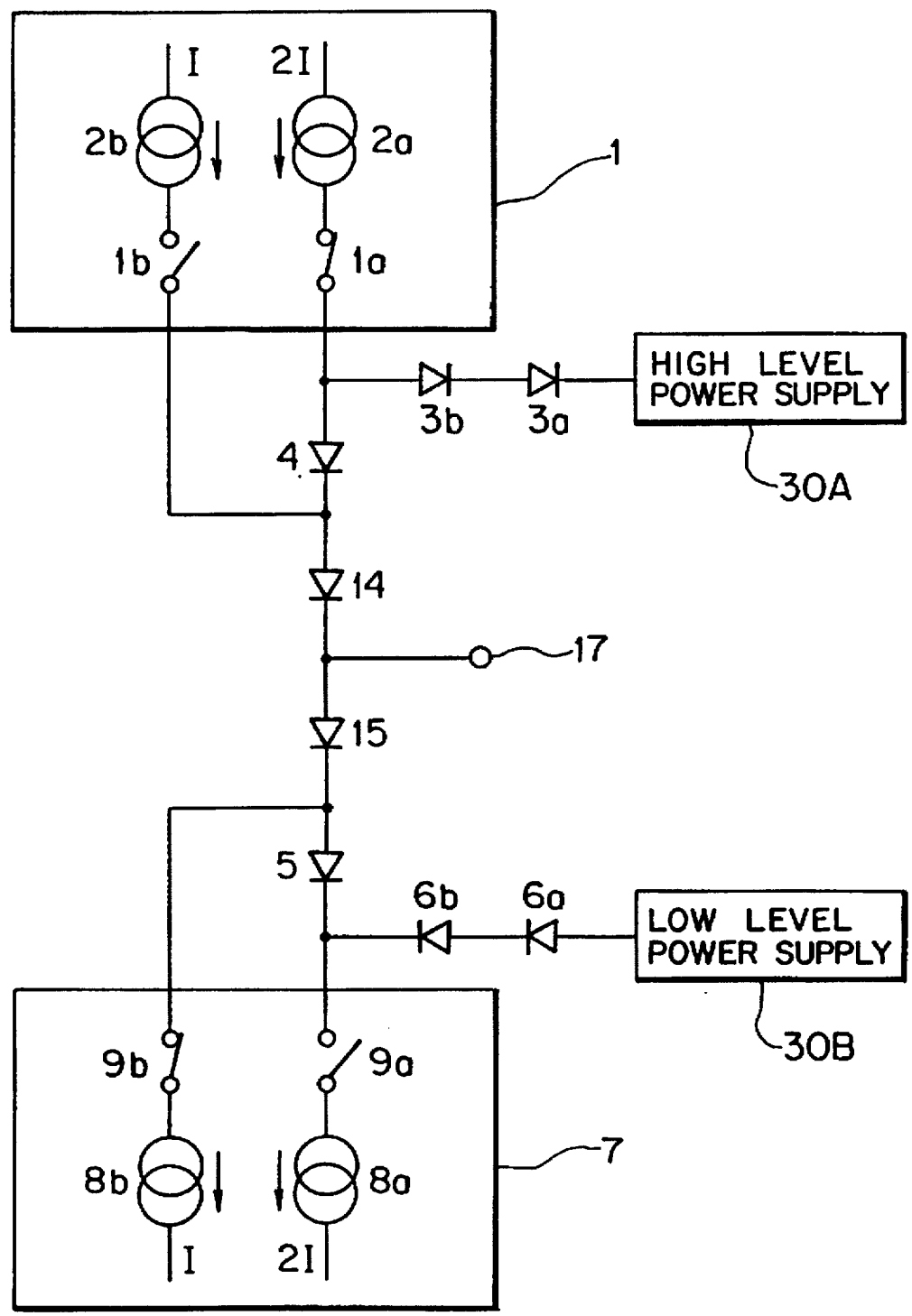
FIG. 1 shows an arrangement of a binary output circuit according to a preferred embodiment of the present invention.
Figure 2:
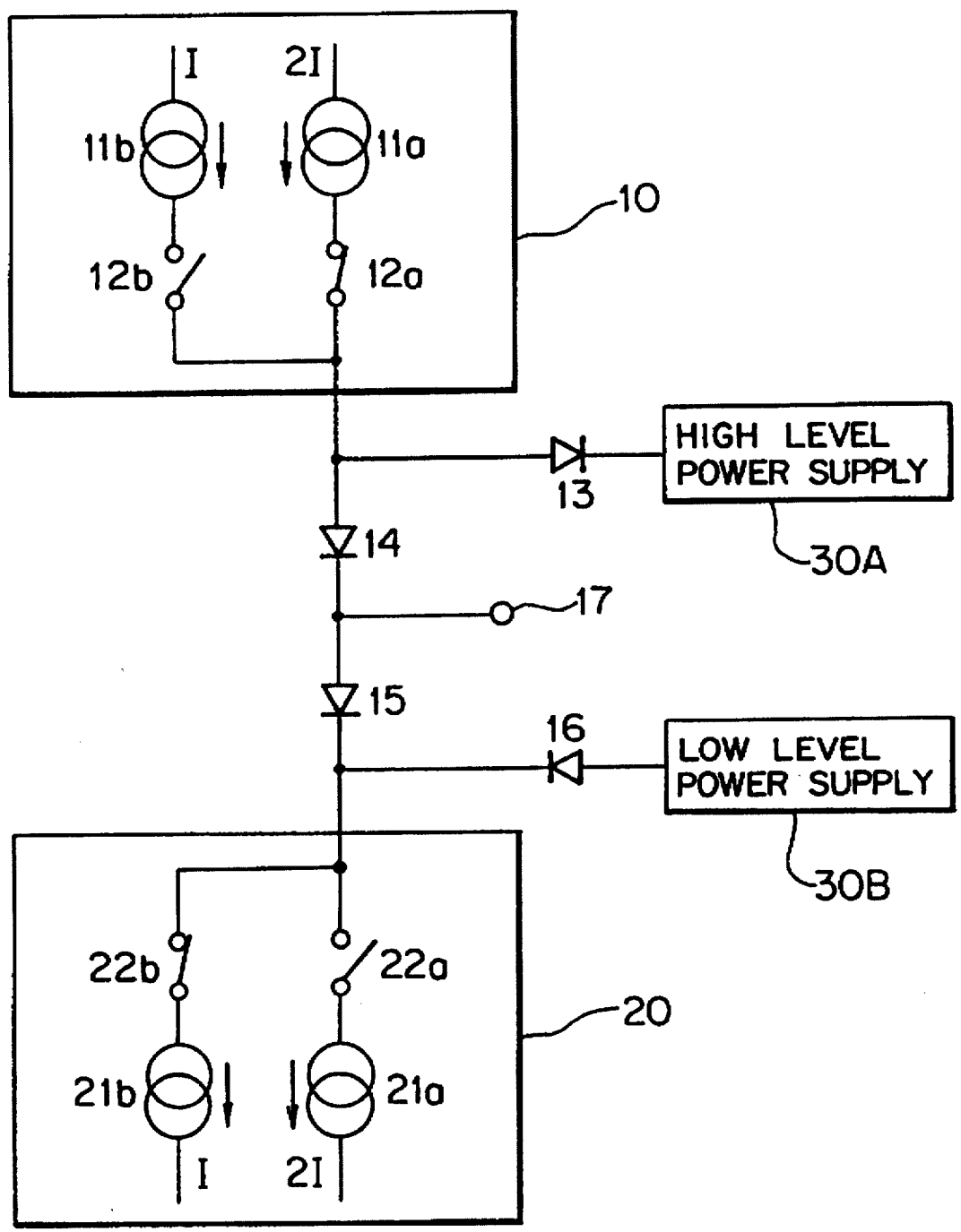
FIG. 2 shows an arrangement of a conventional binary output circuit.

In FIG. 1, denoted by 1 and 7 are switching circuits, 3a, 3b, 4, 5, 6a, and 6b are diodes, diodes 14 and 15 are the same diodes of the conventional binary output circuit as shown in FIG. 2.

In FIG. 1, a switching circuit 1 includes a constant-current supply 2a for flowing the current value 2I, a switch 1a connected in series to the constant-current supply 2a, a constant-current supply 2b for flowing the current value I, and the switch 1b connected in series to the constant-current supply 2b. The switching circuit 7 includes the constant-current supply 8a connected in series to the switch 9a, for receiving the current value 2I a switch 9b, and the constant-current supply 8b connected in series to the switch 9b for receiving the current value I.

The output of the switch 1a of the switching circuit 1 is connected to the high level power supply 30A by way of the diodes 3a and 3b which are connected in series to each other in a forward bias orientation relative to current source 2a, and it is also connected to an anode of the diode 4 which is connected to the anode of diode 3b. The output of the switch 1b is connected to a cathode of the diode 4. The cathode of the diode 4 is connected to the anode of the diode 5 by way of the diodes 14 and 15 which are arranged in the forward bias and connected in series to each other.

The anode of the diode 5 is connected to the switch 9b of the switching circuit 7, and the low level power supply 30B is connected to the cathode of the diode 5 by way of diodes 6a and 6b which are arranged in a forward direction and connected in series to each other. Further, the cathode of the diode 5 is connected to the switch 9a of the switching circuit 7. The output terminal 17 is provided at a connection between the cathode of the diode 14 and the anode of the diode 15.

Switches 1a, 1b and 9a, 9b are electrically controlled switches set by a circuit, not part of this invention, to set the voltage level of the signal present at output terminal 17.

The operation of the binary output circuit of the present invention will be described hereafter with reference to FIG. 1.

In FIG. 1, when the voltage VH of the high level power supply 30A is outputted to the output terminal 17, the switch 1a of the switching circuit 1 is closed so as to flow the current value 2I from the constant-current supply 2a while the switch 1b is open. On the other hand, the switch 9b operates in the switching circuit 7 so as to flow the current value I through the constant-current supply 8b while the switch 9a is open.

With such an arrangement, the current value I flows from the constant-current supply 2a to the constant-current supply 8b by way of the diodes 4, 14 and 15. Consequently, the remaining current value I flows to the high level power supply 30A by way of the diodes 3a and 3b. When there is no load in the output terminal 17, the current value I flows equally through the diodes 3a and 3b, and the diodes 4 and 14. Since the characteristics of these diodes are equal to one another, the voltage VH of the high level power supply 30A is outputted to the output terminal 17.

When the voltage VL of the low level power supply 30B is outputted to the output terminal 17, the switch 1b of the switching circuit 1 operates so as to flow the current value I from the constant-current supply 2b while the switch 1a is not operative. On the other hand, the switch 9a operates in the switching circuit 7 so as to flow the current value 2I through the constant-current supply 8a while the switch 9b is open.

With such an arrangement, the current value I flows from the constant current source 2b of the switching circuit 1 to the constant-current supply 8a by way of the diodes 14, 15 and 5. Further, the remaining current value I flows from the low level power supply 30B to the constant-current supply 8a of the switching circuit 7 by way of the diodes 6a and 6b. When there is no load in the output terminal 17, the current value I flows equally through the diodes 6a and 6b, and the diodes 15 and 5, and further since the characteristics of these diodes are equal to one another, the voltage VL of the low level power supply 30B is outputted to the output terminal 17. When nor switches 1a and 1b of the switching circuit 1 and the switches 9a and 9b of the switching circuit 7 are open, the voltage V0 of the output terminal 17 is put in high impedance.

When the difference in voltage level between the voltage VH of the high level power supply 30A and the voltage VL of the low level power supply 30B is small, when the voltage VH is outputted, the diodes 6a and 6b connected to the low level power supply 30B are not conductive since the diode 5 for preventing the current from the low level power supply 30B is connected in a reverse bias mode relative to low level power supply 30B, and hence the voltage VH of the high level power supply 30A is correctly outputted.

When the voltage VL of the low level power supply 30B is outputted, the diodes 3a and 3b to be connected to the high level power supply 30A are not conductive since the diode 4 for preventing the current from the high level power supply 30A is connected in reverse bias mode relative to the current flow from constant current source 2b. Consequently, the voltage VL of the low level power supply 30B is correctly outputted.

With such a circuit arrangement, when the switching circuits 1 and 7 are switched at high speed, the voltages VH or VL can be outputted from the output terminal 17 regardless of their relative difference in voltage levels.

Figure 3:
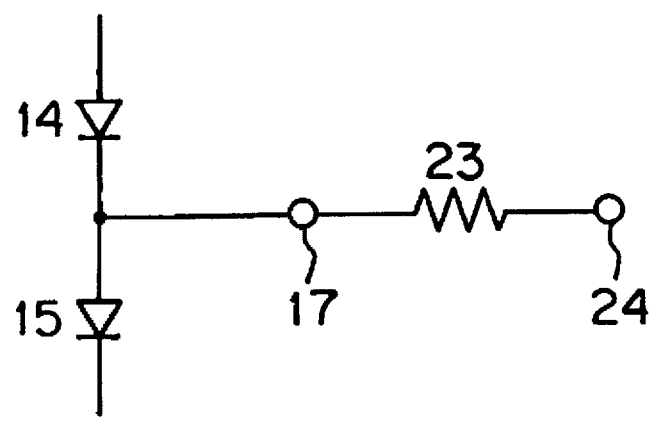
FIG. 3 is a driver circuit constituting the binary output circuit according to the present invention.

The driver circuit generally has an arrangement, as shown in FIG. 3, provided with a resistor 23 connected to the output terminal 17 of FIG. 1, wherein the direct current resistance rd is added to the resistance value R0 of the resistor 23 so that an output impedance viewing from a driver output terminal 24 becomes rd+R0, thus forming a binary output circuit. Since a load current from the driver output terminal 24 is determined by a current I flowing to the diodes 14 and 15, the current I is needed to have such a relatively large value to drive the load.

Although the arrangement of FIG. 1 shows a state where two diodes are connected to the input of the high level power supply 30A, and another two diodes are connected to the lower level power supply 30B, the number of the diode to be connected to the high level power supply 30A and the low level power supply 30B may be one.

With the arrangement of the present invention, when the voltage VH of the high level power supply is outputted, the current from the low level power supply is prevented by the diode anode of which is connected to the output of the high level power supply, while when the voltage VL of the low level power supply is outputted, the current from the high level power supply is prevented by the diode cathode of which is connected to the output of the low level power supply, and hence a correct output can be obtained regardless of the large or small amplitude of the power supply.

What is claim is:

1. An output circuit for selectively outputting a voltage at one of two voltage levels, said output circuit comprising:

a first switching circuit having: a first constant current source producing a first constant output current; a first switch connected to said first constant current source for controlling discharge of the first constant output current; a second constant current source producing a second constant output current that is different from the first constant output current; and a second switch connected to said second constant current source for controlling discharge of the second constant output current;

a second switching circuit for receiving the current produced by said first switching circuit, having: a third constant current source for receiving the first constant output current; a third switch connected to said third constant current source for controlling the application of current to said third constant current source; a fourth constant current source for receiving the second constant output current; and a fourth switch connected to said fourth constant current source for controlling the application of current to said fourth constant current source;

first, second, third and fourth diodes that are series-connected together in sequence and forward biased between said first and second switching circuits so as to allow current flow from said first switching circuit to said second switching circuit, wherein said first switch is connected to a junction between said first and second diodes, said second switch is connected to an anode of said first diode, said third switch is connected to a junction between said third and fourth diodes, and said fourth switch is connected to a cathode of said fourth diode;

a first power supply for producing a first voltage, said first power supply being connected to a junction of said second switch and said first diode by a fifth diode that is forward biased relative to said second constant current source;

a second power supply for producing a second voltage different from the first voltage, said second power supply being connected to a junction of said fourth diode and said fourth switch by a sixth diode that is forward biased relative to said fourth constant current source; and an output terminal located at a junction of said second and third diodes;

wherein said first and fourth switches are opened and closed together and said second and third switches are opened and closed together so as to cause a signal having either the first voltage or the second voltage to be outputted from said output terminal.

2. The output circuit of claim 1, wherein: said second constant current source produces a current having a value twice the value of the current produced by said first constant current source; and said fourth constant current source receives a current having twice the value of the current received by said third current source.

3. The output circuit of claim 1, wherein: a seventh diode is series connected between said fifth diode and said first power supply so as to be forward biased relative to said second constant current source; and an eighth diode is series connected between said sixth diode and said second power supply so as to be forward biased relative to said fourth constant current source.

* * * * *